United States Patent

Guenard

[15] 3,676,791

[45] July 11, 1972

[54] MICROWAVE TUBE AMPLIFIER CIRCUIT FOR APLITUDE MODULATED AND FREQUENCY MODULATED MICROWAVE SIGNAL

[72] Inventor: Pierre Guenard, Paris, France

[73] Assignee: Thomson-CSF

[22] Filed: March 12, 1971

[21] Appl. No.: 123,582

[30] Foreign Application Priority Data

March 17, 1970 France ..................................7009520

[52] U.S. Cl. ..................................330/43, 330/126, 332/17

[51] Int. Cl. ..........................................................H03f 3/58

[58] Field of Search ........................330/43, 44, 49, 124, 126; 329/135, 113; 332/7, 17

[56] References Cited

UNITED STATES PATENTS 2,919,374 12/1959 Harrison ................................332/7 X

*Primary Examiner*—Roy Lake
*Assistant Examiner*—James B. Mullins
*Attorney*—Cushman, Darby & Cushman

[57] ABSTRACT

Circuit improving the efficiency of microwave tubes for amplification of an amplitude and frequency modulated signal, comprising a conventional amplifier tube with an electron current control electrode, and a device for splitting the signal into two separate signals, one of them being the amplitude modulation envelope to be sent to said control electrode, the other being the microwave frequency-modulated signal alone, to be sent to the amplifier microwave input.

2 Claims, 4 Drawing Figures

Figure 1:
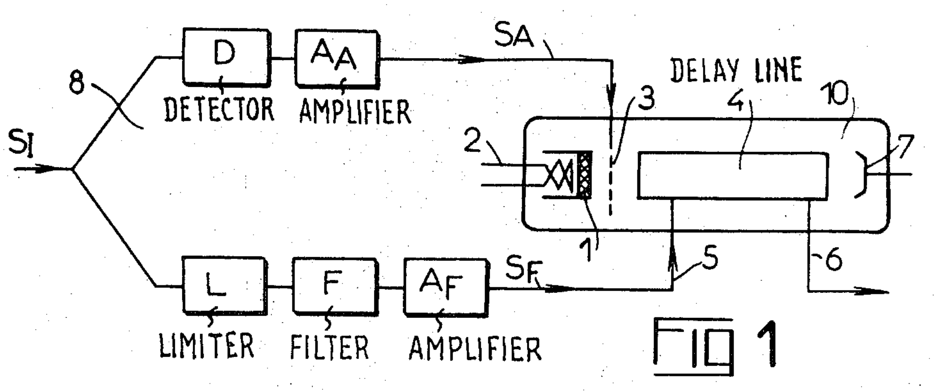

MICROWAVE TUBE AMPLIFIER CIRCUIT FOR APLITUDE MODULATED AND FREQUENCY MODULATED MICROWAVE SIGNAL

The present invention relates to high frequency modulation devices applied to electronic tubes, and more particularly to microwave amplifier tubes.

It is known that two main modulation modes are usable, namely amplitude modulation and frequency modulation.

In the first case, the electronic beam current of the tube is modulated, by use of a control electrode as, for example, a grid, fed by the modulation signal, the level of which being ajusted at such a value that the maximum current, — and thus the microwave output power — is obtained for the modulation peaks, and that the current is zero when the output power is zero, leading to the better microwave efficiency.

In the second case, is applied at the microwave input of the amplifier tube the microwave signal itself, frequency modulated, but with a constant amplitude, the level of which being ajusted in such a way that, at the maximum amplitude of the input signal, the output signal is as large as possible, that is to say close to the saturation level, taking into account the limitations which the requisite linearity conditions pose in this field. Thus, maximum efficiency is achieved.

But a serious drawback appears in the applications where the microwave signal is simultaneously modulated in both of the two modes, namely amplitude and frequency modulations. This is the case, for example, with single sideband devices (SSB) or independent sideband devices (ISB).

In fact, in this case, it is no longer possible to have the benefit of the high efficiency characteristic of an electronic beam current modulation, because of the control electrode limited bandwidth.

Practically, the double-modulated signal is applied to the amplifier microwave input, that leads to an overall poor efficiency : in fact, when the input signal amplitude is maximum, efficiency, as already shown, is maximum too; but when it is low, during a low modulation level lapse of time, the output power decreases nearly proportionally to the input signal and, as the applied DC power to the tube remains constant, the efficiency then becomes very poor. The mean efficiency of the tube can even be very much less than half the maximum efficiency.

It should be necessary to separate the two modulation modes applied to the tube, in applying the amplitude modulation alone to the current beam control electrode, and the frequency-modulated signal alone to the microwave input of the tube.

This modulation mode separation is achieved by the device according to the invention.

More precisely, it is provided an amplifier circuit for the amplification of a microwave signal, said signal being partly amplitude modulated and partly frequency or phase modulated, using a microwave amplifier tube with an electron source, an electrode for controlling the electron beam emitted by said source, an HF amplifier circuit with an HF input and an HF output, and an electron catcher, characterized in that it comprises an HF input referred to as the main input, designed to receive the signal for amplification, said main input supplying two channels, the first of which contains an amplitude detector and the second an amplitude limiter and a filter, the output of said first channel being connected to the control electrode of said tube, and the output of the second channel being connected to the HF input of the amplifier circuit of said tube.

Figure 2:
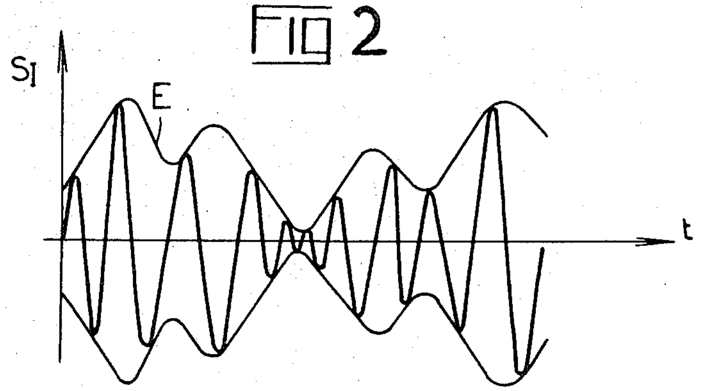
Figure 3:
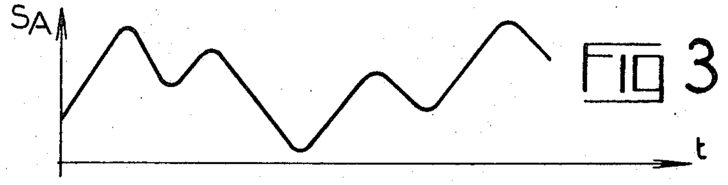
Figure 4:
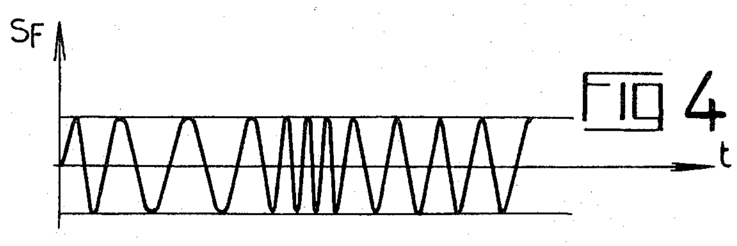

The invention will be better understood from a consideration of the ensuing description and the drawings attached thereto, in which :

FIG. 1 schematically illustrates a microwave amplifier circuit in accordance with the invention ;

FIG. 2 illustrates the variations, as a function of time, in the frequency and amplitude of the initial signal applied to the input of the circuit in accordance with the invention ; and FIGS. 3 and 4 respectively illustrate the variations in the signals applied to the amplifier tube.

The microwave amplifier tube 10 schematically illustrated in FIG. 1 is constituted by a cathode 1 indirectly heated by a filament 2, a control electrode 3, in this case a grid, and a microwave circuit 4 constituted by the delay line for example, said circuit being equipped with a microwave input 5 and a microwave output 6. A catcher or collector 7 is designed to receive the electrons coming from the cathode 1. Said amplifier tube is associated with the device 8 which enables the initial microwave signal $S_I$ applied to the device, to be split into two signals $S_A$ and $S_F$.

Said device 8 to which the initial signal $S_I$ is applied and the diagram of which is shown in FIG. 1, comprises on the one hand a detector device D and an amplifier device $A_A$ producing a signal $S_A$ of relatively low frequency, reproducing the amplitude modulation of the signal $S_I$, and on the other hand an amplitude limiter L, a filter F and an amplifier $A_F$, producing the microwave signal $S_F$ of constant amplitude whose instantaneous frequency is equal to the instantaneous frequency of the signal $S_I$.

The signal $S_A$ coming from the device 8 is applied to the control electrode 3 whilst the signal $S_F$ is applied to the microwave input of the microwave circuit 4 of the amplifier tube.

In operation, it is easily possible to regulate the amplifiers $A_A$ and $A_F$ shown in FIG. 1, enabling the levels of the signals $S_A$ and $S_F$ to be controlled so that, for the peaks of the amplitude modulation signals, the desired maximum power is obtained, with the best efficiency, and so that the HF output power becomes zero exclusively when the amplitude modulation disappears.

In FIG. 2 the signal $S_I$ has been illustrated as a function of time, whilst in FIG. 3, the signal $S_A$, whose amplitude varies with the amplitude of the curve E, namely the envelope of the signal $S_I$, is shown. In FIG. 4, the curve illustrates the signal $S_F$ of constant amplitude whose frequency is equal to that of the signal $S_I$ of FIG. 2.

The circuit in accordance with the invention can be used with all kinds of microwave amplifier tubes such as klystrons, travelling wave amplifier tubes, amplifiers with crossed electric and magnetic fields, and substantially improves the efficiency of the amplifier stages of said tubes when the signal to be amplified simultaneously exhibits amplitude modulation and frequency (or phase) modulation.

This circuit, described schematically here, can take a variety of forms, and in particular it is possible to associate with it devices for correcting the distortion which is inevitably introduced by the characteristics which link the voltage of the beam control electrode to the HF output power from the amplifier tube.

Of course, the invention is not limited to the embodiment described and shown which was given solely by way of example.

What is claimed is :

1. An amplifier circuit for the amplification of a microwave signal, said signal being partly amplitude modulated and partly frequency or phase modulated, using a microwave amplifier tube with an electron source, an electrode for controlling the electron beam emitted by said source, an HF amplifier circuit with an HF input and an HF output, and an electron catcher, characterized in that it comprises an HF input referred to as the main input , designed to receive the signal for amplification, said main input supplying two channels, the first of which contains an amplitude detector and the second an amplitude limiter and a filter, the output of said first channel being connected to the control electrode of said tube, and the output of the second channel being connected to the HF input of the amplifier circuit of said tube.

2. A circuit as claimed in claim 1, characterized in that the signal coming from said first channel is a low frequency signal whose amplitude is that of the envelope of the signal being amplified; and in that the signal coming from said second channel is a signal of constant amplitude whose instantaneous frequency is equal to the instantaneous frequency of the signal being amplified.

* * * * *